United States Patent

[11] 3,597,699

[72] Inventor Arnold J. Seipel
Wycoff, N.J.
[21] Appl. No. 812,665
[22] Filed Apr. 2, 1969
[45] Patented Aug. 3, 1971
[73] Assignee Ohmega Laboratories
Pine Brook, N.J.

[54] PHASE-LOCKED SWEEP AND CONTINUOUS WAVE GENERATOR
4 Claims, 11 Drawing Figs.

[52] U.S. Cl. .......... 331/18, 307/226, 307/232, 330/21, 330/30 D, 331/1 A, 331/25, 331/44, 331/178, 333/72
[51] Int. Cl. .......... H03b 3/04
[50] Field of Search .......... 331/18, 1 A, 25, 178

[56] References Cited
UNITED STATES PATENTS
3,413,565 11/1968 Babany et al. .......... 331/18

*Primary Examiner*—Roy Lake
*Assistant Examiner*—Siegfried H. Grimm
*Attorney*—March, Le Fever, Wyatt and Lazar

ABSTRACT: As in existing frequency synthesizers, the frequency of a main tunable oscillator is controlled by being phase locked to a voltage obtained by comparing a pulse signal of comparable frequency derived by dividing the oscillator signal frequency by the necessary divisor. Binary-coded decimal switches set the divisor in steps equal to the standard frequency. A central feature of the present invention is a calibrated potentiometer supplied with a voltage that is inversely proportional to the frequency of the main oscillator and is of such a magnitude that moving the arm of the potentiometer from one end to the other will vary the frequency of the main oscillator continuously over a range which is equal to the difference between two successive frequencies determined by the switches, no matter what the frequency of the main oscillator may be. The voltage at the arm of the potentiometer is connected to the standard-frequency generator to modify its frequency a certain percentage, and a sweep signal may also be applied to sweep the standard signal over a limited band and thus sweep the signal of the main oscillator over a controlled band while still retaining a phase-locked condition.

INVENTOR.
ARNOLD J. SEIPEL

BY

March, Le Fever, Wyatt & Lazar
his ATTORNEYS

INVENTOR.
ARNOLD J. SEIPEL
BY
March, LeFever, Wyatt & Lazar
his ATTORNEYS

INVENTOR.
ARNOLD J. SEIPEL

BY

March, LeFever, Wyatt & Lazar
his ATTORNEYS

INVENTOR.
ARNOLD J. SEIPEL
BY
Marek, LeFever, Wyatt & Lazar
his ATTORNEYS

INVENTOR.
ARNOLD J. SEIPEL

BY

Marechal, LeFever, Wyatt & Lazar
his ATTORNEYS

INVENTOR.
ARNOLD J. SEIPEL
BY
March, Lefever, Wyatt & Lazar
his ATTORNEYS

INVENTOR.
ARNOLD J. SEIPEL
BY
March, LeFever, Wyatt & Lazar
his ATTORNEYS

PHASE-LOCKED SWEEP AND CONTINUOUS WAVE GENERATOR

This invention relates to variable-frequency signal generators, or frequency synthesizers, based upon phase locking the output signal to a standard signal. In particular, it relates to control circuits for varying the frequency of such generators by a specific number of cycles per second by means of a calibrated control, no matter where the frequency of the oscillator is within its permissible range.

Phase-locked oscillators are controlled by dividing the output frequency by a divisor that will result in a lower frequency which can be compared with a standard frequency to generate a signal that controls the oscillator. For example, a frequency of 5.17 MHz. may be divided by 517 to produce a 10 kHz. signal that can be compared with a 10 kHz. standard signal. The setting of the frequency-dividing circuits by calibrated switches actually determines the frequency of the oscillator, since if the divisor is changed to 602, the control signal will lock the frequency of the phase-locked oscillator on the new setting of 6.02 MHz. It is standard practise to use binary frequency dividers controlled by, for example, a three digit set of binary-coded decimal switches. Heretofore, such systems, called frequency synthesizers, have been capable of generating only specific frequencies which change in increments determined by the third (or last) digit of the binary-coded decimal switch.

In accordance with the present invention, a direct voltage is produced having a magnitude inversely proportional to the output frequency of the main oscillator and is available to vary the standard frequency a relatively small amount so as to vary the frequency $f_c$ of the main oscillator while still maintaining phase-locked control. This voltage may, for example, be derived from the frequency-divider system in the form of two series of pulses, one series having a repetition rate $R=f_c/N$, which is equal to the standard frequency and in which $N$ is the multidigit number or divisor determined by the setting of the switches, and the other having a repetition rate $r=f_c/n$, in which $n$ is a unit of the largest significant digit of that number. To give a specific example, if the standard frequency is 10 kHz. and $f_c$ is 5.17 MHz., $N$ will be 517 and $n$ will be 100. Each pulse of the first series resets a flip-flop and the next succeeding pulse of the second series, which lags behind the resetting pulse by an interval dependent upon the frequency of the main oscillator, triggers the flip-flop to the opposite state. As a result, the flip-flop produces an output voltage which has a duty cycle, and therefore an average direct voltage component, inversely proportional to the frequency of the main oscillator.

After the average direct voltage is obtained, for example by integrating the output pulses of the flip-flop, it may be applied across a precision linear potentiometer having a calibrated dial. The dial may comprise several digits and be located adjacent the calibrated switches so that the setting of the switches plus the setting of the dial may be read as a single number having, for example, six digits. The frequency of the oscillator may thus be set not just at 5.17 or 5.18 MHz. but any frequency in between, such as 5.17326 MHz.

The standard signal is obtained in accordance with the present invention by mixing the output signal of two accurately controlled oscillators, which preferably use crystals as the frequency-controlling elements. Even crystal oscillators may have their frequency shifted a small percentage by a control voltage and in the present invention the control voltage is the output signal at the arm of the precision potentiometer. The low-frequency signal produced by mixing the output of the voltage controlled crystal oscillators is applied to another frequency divider, the output of which is a series of pulses referred to above as the standard frequency signal. Varying the setting of the potentiometer varies the standard frequency and thus the frequency of the main oscillator.

Since it is intended that the numbers on the dial of the potentiometer represent actual frequency in Hertz or, more customarily, kiloHertz, and since a frequency change of one kiloHertz, say, represents a smaller percentage change if the frequency of the main oscillator is 5 MHz. than if it is 2 MHz., it is clear that the permissible frequency shift obtained by tuning the potentiometer over its entire range must produce a correspondingly greater percentage change when the output frequency is at the low end of the tuning band of the main oscillator than at the high end. In a specific embodiment, tuning the potentiometer over its range will result in tuning the output frequency from 5.50000 MHz. to 5.50999 MHz. or, with a different setting of the main oscillator, from 2.75000 MHz. to 2.75999 MHz. even though the percentage frequency change in these two examples is almost 1:2. If the voltage across the potentiometer were constant, that is, independent of the frequency of the main oscillator, the frequency change effected by tuning the potentiometer would be a percentage of the frequency, and the calibration of the dial of the potentiometer would not be related to the actual frequency. To take the same example, if the voltage across the potentiometer were constant and had a magnitude sufficient to modify the tuning by 10 kHz. from 5.50000 MHz. to 5.50999 MHz., that same voltage would produce change of 25 kHz. at a center frequency of about 2.75 MHz.

In addition to permitting the frequency of the main oscillator to be set at any value within the permissible band of operation and indicated to an accuracy greater than is possible with switch-controlled frequency dividers, the present invention also permits the output frequency of the main oscillator to be swept over a limited portion of its permissible band while still retaining phase lock control. This may be accomplished by applying a sweep signal to the voltage-controlled crystal oscillators to vary their frequencies over a limited range. The sweep voltage may be synchronized with sweep circuits in an oscilloscope to permit a pattern to be derived corresponding to the band-pass characteristics of a filter or amplifier to which the sweep signal from the main oscillator is applied.

The invention will be described in greater detail in connection with the following drawings in which.

Figure 1:
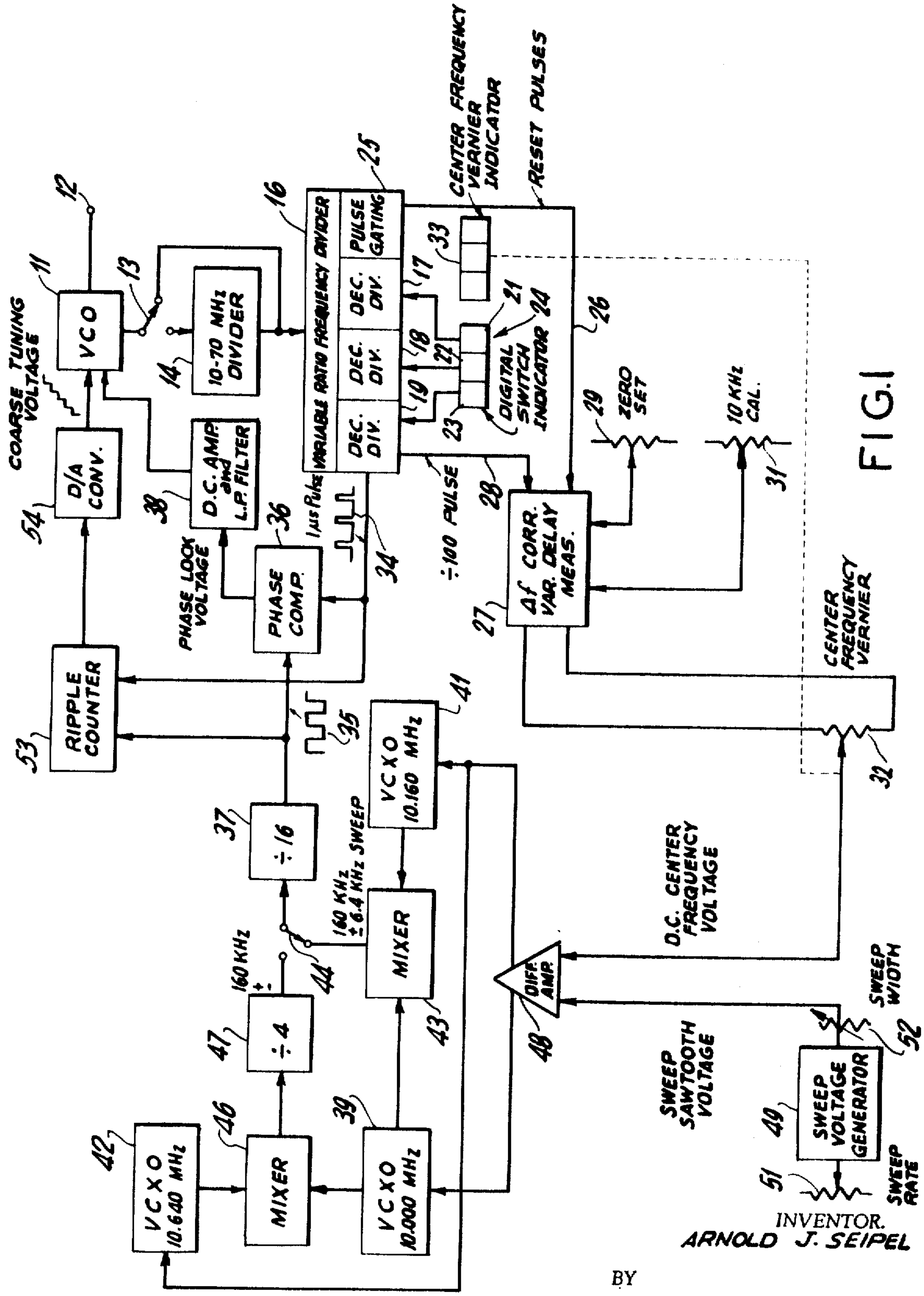
FIG. 1 is a block schematic diagram of the signal generating system of the invention.
Figure 7A:
Figure 7B:
Figure 7C:
Figure 6:
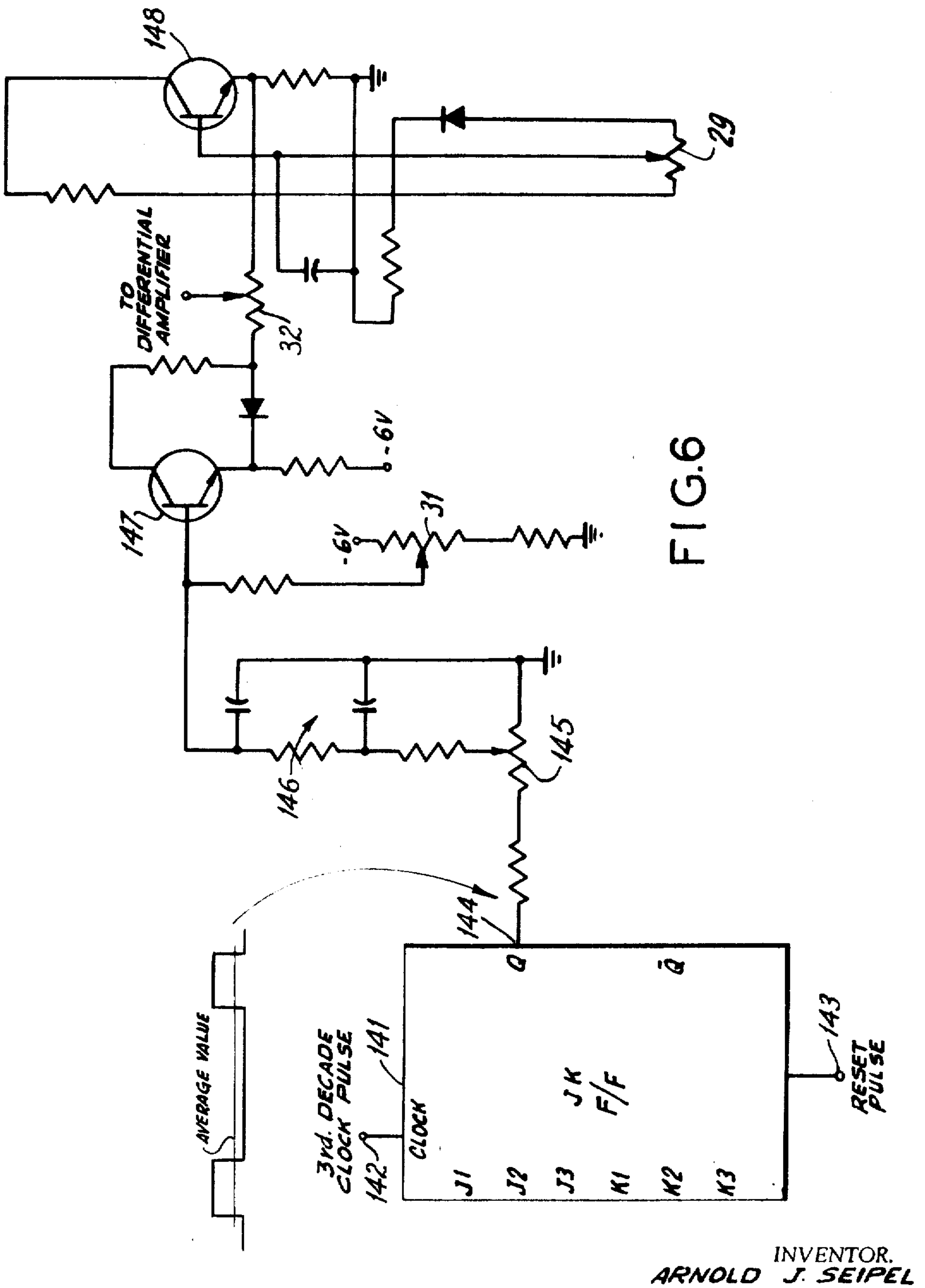
FIG. 6 is a schematic circuit diagram of a $\Delta f$ correction circuit used in the system in FIG. 1.
Figure 8:
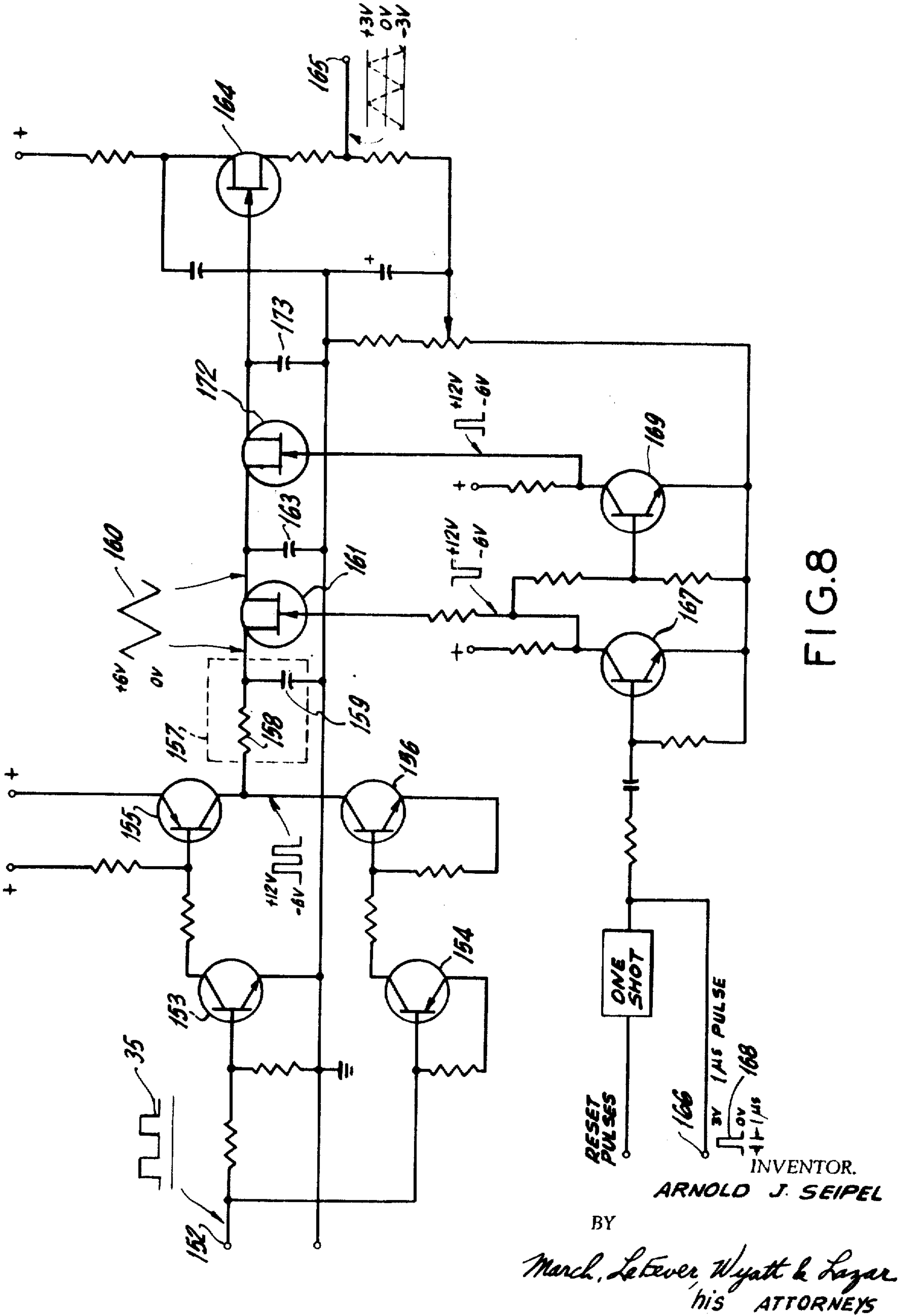
Figure 9:
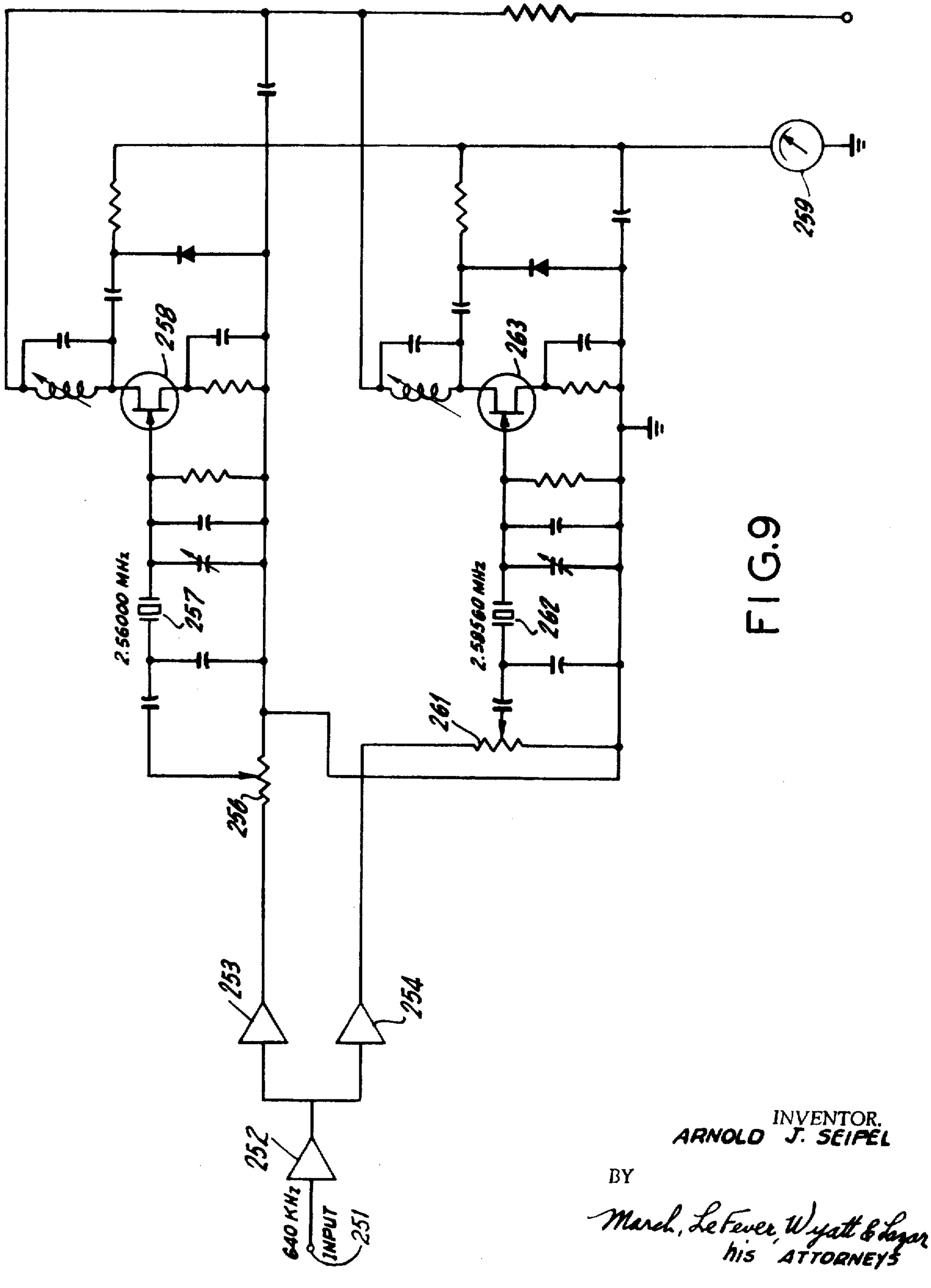

FIGS. 7a—7c show voltage waveforms that occur in the operation of the circuit in FIG. 6;

FIG. 8 is a schematic circuit diagram of a phase comparison circuit as used in the system in FIG. 1; and FIG. 9 is a schematic circuit diagram of a crystal calibrator circuit as used in the system in FIG. 1.

OVERALL SYSTEM

The system shown in block diagram in FIG. 1 includes a main source of oscillations identified as a voltage controlled oscillator (VCO) 11 which, in accordance with standard practice, may comprise two controlled oscillators together with a differential amplifier to apply controlling voltage to them and a mixer and low-pass filter to combine their output signals into a single output signal to be connected to an output terminal 12. The VCO 11 has a second output connected to a switch 13 to be conducted either to a divider circuit 14 if the VCO 11 has a high output frequency or to a variable-ratio frequency divider 16 if the output frequency of the VCO 11 is somewhat lower. The only necessity for the divider 14 is to reduce the frequency of signals applied to the divider 16 to a range that can be more easily accommodated.

The variable-ratio frequency divider 16 includes three decade dividers 17—19 controlled, respectively, by digital switches 21—23, each of which has an indicator with numbers from 0 to 9 thereon. The indicators are combined as a dial 24 to present a three digit number according to the setting of the three switches. The three decade dividers 17—19 are supplied with pulses from a pulse gating circuit 25. The pulses supplied to divider number 17 are at the same rate as the frequency of the signal from either the switch 13 or the divider 14, the pulses supplied to the divider 18 have a repetition rate one-tenth the incoming frequency and the pulses applied to the third divider 19 have a repetition rate one one-hundredth of the incoming frequency.

In addition the pulse-gating circuit 25 supplies reset pulses via a line 26 to a $\Delta f$ correction circuit 27. The third decade divider 19 also supplies pulses via a line 28 to the $\Delta f$ correction circuit 27. The correction circuit 27 has a zero set adjustment 29 and a 10 kHz. calibration potentiometer 31 connected to it. Also connected to the correction circuit 27 is a precision, linear potentiometer 32 which is used as a center frequency vernier and which has an indicator dial 33 associated with it. This indicator is of the digital type and may have, for example, three digits. The indicator is physically located adjacent the digital indicator of the digital switches 21—23 so that the numbers on the dial 24 plus those on the dial 33 may be read as a six digit figure to indicate the output frequency of the VCO 11 to a high degree of accuracy.

The divider 16 also supplies a series of one microsecond pulses 34 to a phase comparison circuit 36 in which the frequency of these pulses is compared with the frequency of other pulses from a divider 37 to obtain a phase lock voltage which is amplified and filtered in a circuit 38, the output of which is connected to control the VCO 11.

The pulses supplied to the divider circuit 37 are generated either by a voltage-controlled crystal oscillator (VCXO) 39 and a second VCXO 41 or by the VCXO 39 and a third VCXO 42. The output signal of the VCXO 39 and the VCXO 41 are combined in a mixer 43, the output of which is connected to one terminal of a switch 44. The output signal of the VCXO 39 and the VCXO 42 are applied to another mixer 46 the output of which is connected through a frequency divider 47 to another terminal of the switch 44. Thus the switch 44 can be used to select either the output of the mixer 43 or the output of the frequency divider 47 and to connect either of these output signals to the divider 37.

The VCXOs 39, 41 and 42 are controlled by the output signals of a differential amplifier 48. One output signal is connected to the VCXO 39, which is nominally tuned in this particular example to a frequency of 10.000 MHz., and the other output of the differential amplifier is connected to both of the VCXOs 41, and 42, one of which is tuned to 10.160 MHz. and the other of which is tuned to 10.640 MHz. These and all specific frequencies referred to in this description should be understood as being merely illustrative and not essential to the practice of the invention.

The differential amplifier 48 receives two input signals, one from the arm of the potentiometer 32 in the form of DC center-frequency voltage and the other from a sweep voltage generator 49. The sweep voltage generator has a sweep rate control 51 to determine the repetition rate, which is typically 60 Hz. or less. The magnitude of the output signal of the sweep voltage generator 49 is controlled by a sweep width potentiometer 52 so that any frequency excursion of the VCXOs 39, 41 and 42 from zero to the maximum permissible amount may be selected.

Since the VCO 11 is not tuned directly but only by way of the frequency divider 16 and phase comparison circuit 36 in phase-locked mode of operation, changing the divisor to a substantially different number so as to change the frequency of the VCO correspondingly will remove the VCO from the locked condition. The VCO 11 could be tuned manually, but an automatic tuning circuit is provided for easier operation. This circuit includes a control 53 which preferably is a ripple counter and which is connected to receive the output signal of the divider 37 and the decade divider 19. The output of the ripple counter is connected to a D/A converter 54 which produces a staircase voltage which is connected to an input terminal of the interval differential amplifier in the VCO 11.

Figure 2:
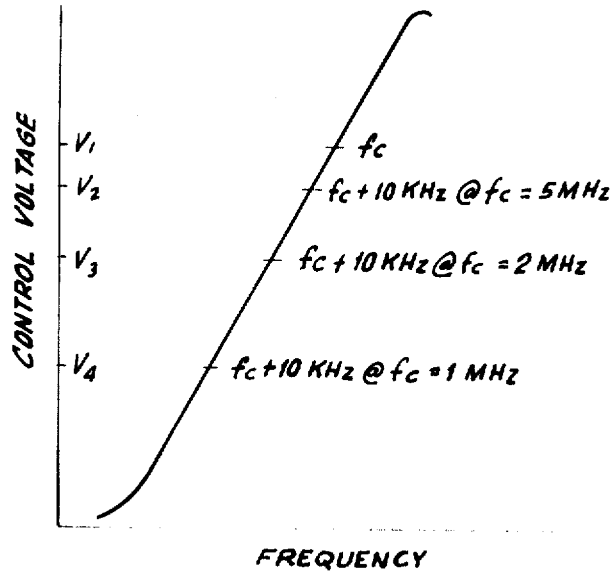
FIG. 2 is a graph illustrating frequency variation in the system of FIG. 1.

FIG. 2 is a graphical representation of the relationship between the control voltage applied from the DC amplifier and low-pass filter 38 to the VCO 11 and the frequency of the output signal of the VCO 11. The frequency $f_c$ shown on the graph may be any frequency within the range of the VCO 11. If $f_c$ is 5 MHz., to take a specific figure, and it is to be varied by 10 kHz. the change, called $\Delta f$, is a relatively small percentage of the value of $f_c$. Hence, only a small change in the control voltage will have to be applied to the VCO 11. This small change is $V_1$, $V_2$ on the graph. But if $f_c$ is lower, say 2 MHz., the control voltage will have to be changed from $V_1$ to $V_3$ to produce a change of 10 kHz. And if $f_c$ is 1 MHz., the change in control voltage from $V_1$ to $V_4$ will have to be twice as great as the change from $V_1$ to $V_3$ to produce the same 10 kHz. shift in output frequency of VCO 11. This assumes a linear relationship between control voltage and frequency.

Figure 3:
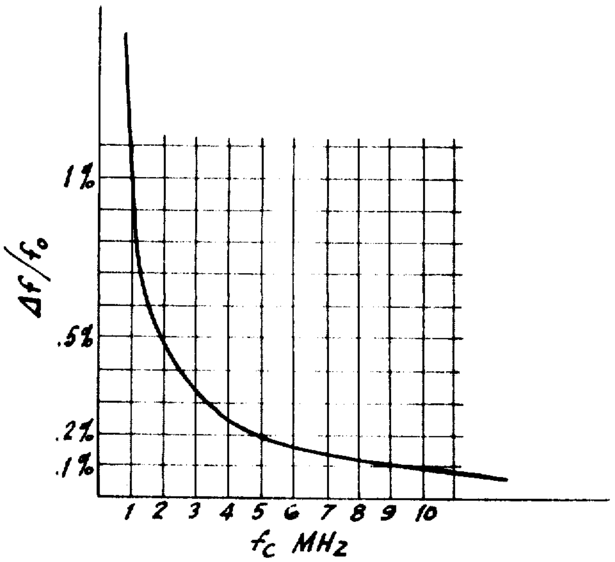
FIG. 3 is a graph illustrating the inverse relationship between incremental frequency change and the center frequency of the system.

FIG. 3 is a graph of the incremental frequency shift of the VCO 11 as a function of the frequency $f_c$. As may be seen, this is a hyperbolic curve.

The system in FIG. 1 functions to produce a correction voltage to be applied by the DC amplifier and low-pass filter 38 to the VCO 11 that increases in exactly the proper relationship to the frequency $f_c$ so that moving the arm of the potentiometer 32 from one end to the other will produce an incremental change of 10 kHz. in $f_c$ through the whole range over which the VCO 11 may be tuned. This requires that the voltage across the potentiometer 32 increase in inverse ratio as the frequency $f_c$ decreases. The circuit that produces this inversely varying voltage across the potentiometer 32 is the $\Delta f$ correction circuit 27, but it, in turn, is controlled by the variable-ratio frequency divider 16.

Variable-Ratio Frequency Divider

The variable-ratio frequency divider 16 in FIG. 1 comprises three decade dividers 17—19, each of which is capable of dividing the frequency of an incoming clock pulse by any number up to 10. These decade dividers are all similar as are their digital control switches 21—23 and therefore it is only necessary to consider one of them in detail.

Figure 4:
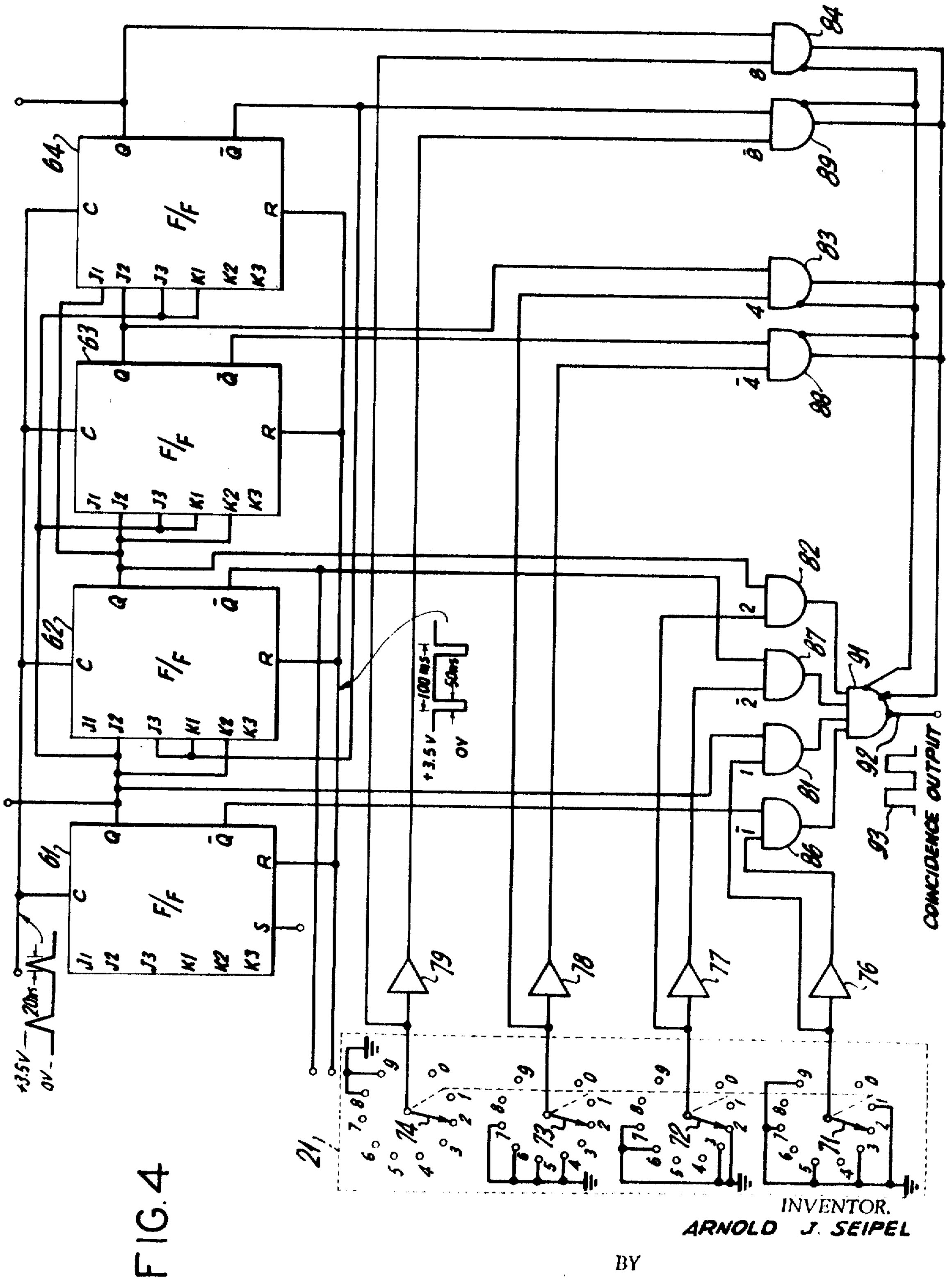
FIG. 4 is a schematic circuit diagram of a decade divider as used in the system in FIG. 1.

The divider 17 is shown in FIG. 4 and comprises four flip-flops 61—64 each connected to an input terminal 66 to which a series of pulses, called clock pulses, is applied. These flip-flops are interconnected in accordance with standard technology so that the incoming clock pulse signal, which consists of simply a series of positive-going pulses, results in the formation by the flip-flop 61 of a pulse signal having a repetition rate one-half that of the repetition rate of the incoming clock pulses and connected to an output terminal 67. The output signal of the fourth flip-flop 64 is a pulse wave that has a repetition rate one-tenth that of the incoming clock pulses and a duty cycle such that it is positive for two intervals of time, each interval being the time between successive clock pulses, and negative for eight intervals of time.

In order to establish the setting of the decade divider 17 in FIG. 4, a digital switch system is incorporated. This is indicated as the switch 21 in FIG. 1 but it actually comprises four 10-position switches, 71—74 ganged together. Again, in accordance with standard technology, each of these switches has 10 terminals and an arm that can be moved to any one of the 10 terminals at a time. The terminals are identified by numbers from 0 to 9, and in the case of the switch 71, the terminals 1, 3, 5, 7 and 9 are connected together to ground. In the case of the switch 72, the terminals 2, 3, 6 and 7 are connected to ground. In the case of the switch 73 the terminals 4 through 7 are connected to ground. In the case of switch 74, the terminals 8 and 9 are connected to ground.

One of these output terminals is connected on a second input terminal of the gate 81 and the other output terminal is connected to a second input terminal of the gate 86. In a similar manner the output terminals of the flip-flop 62 are connected to the gates 82 and 87, output terminals of the flip-flop 63 are connected to the gates 83 and 88 and output terminals of the flip-flop 64 are connected to the input terminals of the gates 84 and 89.

In operation, the clock pulses applied to the four flip-flops 61—64 and the output signals applied along the chain of flip-flops result in an output signal for the first flip-flop 61 that changes from high to low, or 0 to 1, at the occurrence of each of the clock pulses. The output signal of the second flip-flop 62, by virtue of the signals applied to it, changes from one state to the other after the second pulse and each even pulse thereafter until the 10th pulse. In similar fashion, the output signal of the flip-flop 63 changes after the fourth and eighth pulses and the output signal of the flip-flop 64 changes after the eighth pulse.

Coincidence between the settings of the switches 71—74 and the output signals of the four flip-flops 61—64 is measured by whether the voltage at the arms of the switches, which is either high or low properly matches the voltage at the outputs of the flip-flops. To take a specific example the numeral 5 is made up of 1+4 and when the ganged switches 71—74 are set at their respective terminals 5, the arm of the switch 71 will be low, the arm of the switch 72 will be high, the arm of the switch 73 will be low, and the arm of the switch 74 will be high. These conditions are manually set and therefore remain constant. The output signals of the flip-flops change at a rate determined by the clock pulses and after the fifth clock pulse from the beginning of a sequence, the terminal $\overline{Q}$ will be low, the terminal Q of the flip-flop 62 will be low, the terminal $\overline{Q}$ of the flip-flop 64 will be low, and the terminal Q of the flip-flop 64 will be low. The other terminals, Q and $\overline{Q}$, of four flip-flops will have the converse condition and the output terminals of the inverter 76—79 will be the converse of the arms of the switches 71—74. As a result all of the gates 81—89 will have a high signal applied to one of the input terminals and a low signal applied to the other input terminal which is the case for coincidence. The timing of the coincidence output signal 93 will thus be dependent upon how long it takes the clock pulses to the terminal 66 to cause the flip-flop 61—64 to reach a state of coincidence with the settings of the switches 71—74.

The switches 71—74 are connected, respectively, to the inverters 76—79 and to one input terminal of each four NAND gates 81—84. These NAND gates may be referred to as the "1," "2," "4," and "8" gates. The output terminals of the inverters 76—79 are connected, respectively, to one input terminal of four other NAND gates 86—89. The gates 81, 82, 86 and 87 are connected to input terminals of an expandable gate 91 and the gates 83, 84, 88 and 89 are expander gates which are also connected to the expandable gate 91. The output of the gate 91 is connected to a coincidence output terminal 92 and coincidence between the setting of the switches 71—74 and output terminals of the flip-flops 61—64 is indicated by the occurrence of a short, positive going pulse 93 of about 50 *ns.* duration. The first flip-flop 61 has two output terminals which, at all times, have converse output voltages.

It may be noted that a preset terminals 94 is provided for the flip-flops 61, but this is required only for the first decade divider 17. All of the flip-flops 61—64 have a common reset input terminal 96 that resets them to their initial state when coincidence has been reached with all of the decade dividers 17—19.

Pulse-Gating Circuit

Figure 5:
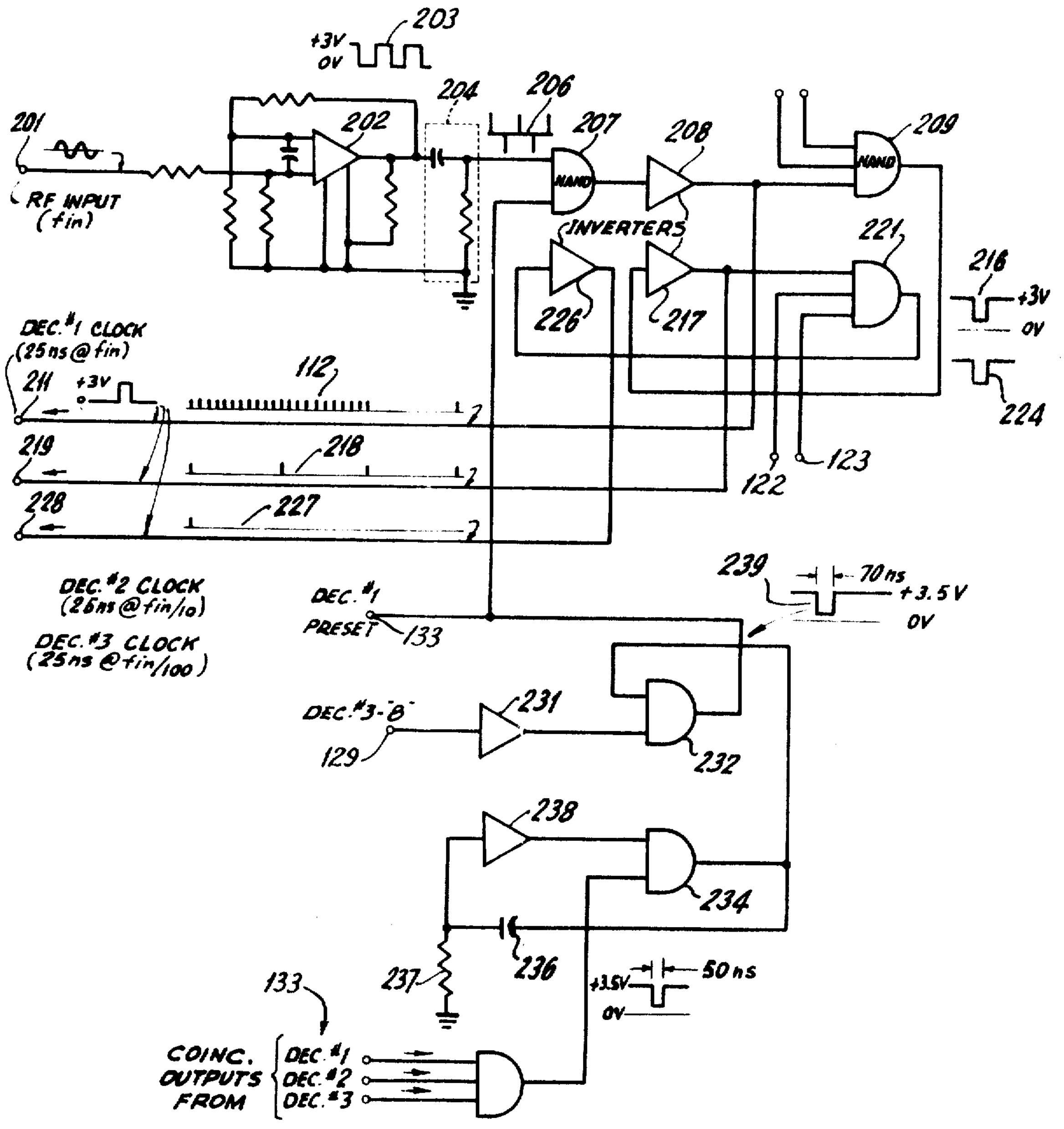
FIG. 5 is a schematic circuit diagram of a pulse gating circuit as used in the system in FIG. 1.

The pulse-gating circuit 25 is also part of the variable-ratio frequency divider 16 and, 95 shown in FIG. 5, comprises an input terminal 201 to which the RF signal from the VXO 11 is applied. This input terminal is connected to an amplifier, or squaring circuit 202, that transforms the sinusoidal input signal into a square wave 203 which is applied to a differentiating circuit 204 to produce a series of sharp impulses, both negative and positive as indicated by the wave form 206. This wave is applied to a NAND gate 207 which, except when the divisor established by the switches 17—19 (FIG. 1) is greater than 800, merely transmits the positive pulses to an inverter 208 the output of which is connected to another NAND gate 209 and to the clock input terminal of the first decade divider 17. As shown in FIG. 4, this is the terminal 66. The repetition rate of the pulse signal 212 at the terminal 211 is the same as the frequency of the RF input signal, and is, by definition, the clock signal for the first decade divider 17.

The NAND gate 209 has tow other input terminals 113 and 114 which are connected to the first decade divider 17. The terminal 113 receives a binary 1 signal from the terminal 67 of the flip-flop 61 (FIG. 4), and the terminal 114 receives a binary 8 signal from the Q terminal of the flip-flop 64. The purpose of the signals applied to the terminal 113 and 114 is to open the NAND gate 209 on the ninth count so that the 10th count from the inverter 208 passes through and becomes a negative-going pulse signal 216. This signal is applied to an inverter 217 to transform the negative pulses into positive pulses, as indicated by the waveform 218, and is connected to an output terminal 219. These pulses have a repetition rate of one-tenth the frequency of the RF signal and the pulses are used as the clock signal for the second decade divider 18.

The output of the inverter 217 is also applied to a NAND gate 221 which has two other input terminals 122 and 123 connected, respectively, to receive the binary 1 and the binary 8 signal of the decade divider 18. This NAND gate is actuated the same way as the NAND gate 109 whereby the binary 1 and the binary 8 signals applied to the terminals 122 and 123 open that gate for the 10th pulse from the inverter 217 to pass through as a negative pulse signal 224. This signal is connected to an inverter 226 to be transformed into a positive pulse signal 227 having a repetition rate of one one-hundredth the repetition rate of the pulses 112. This signal is connected to an output terminal 228 and is the clock signal for the third decade divider 19.

For divisors in excess of 800, a false reset pulse is necessary and for this purpose the binary 8 signal from the third decade divider 19 is connected to an input terminal 129 and from there to an inverter 231, the output of which is connected to one input of a NAND gate 232. A reset pulse is applied to a terminal 133 that serves as the input terminal to a NAND gate 234, the output of which is connected by way of an RC coupling circuit comprising a capacitor 236 and a resistor 237 to another inverter 238. The output of the inverter 238 is connected to another input of the NAND gate 234 so that the NAND gate 234 and the inverter 231 comprise a one-shot circuit that produces a negative pulse 239. The leading edge of this pulse is coincident with the leading edge of the reset pulse signal applied to the terminal 133, but the pulse 239 is longer, and its trailing edge is determined by the time constant of the RC coupling capacitor 236 and resistor 237. This pulse signal 239 is connected to the second input terminal of the NAND gate 232 and the output of this NAND gate is connected to the second input of the NAND gate 207 to control the pulse immediately following the reset pulse in the case of divisors over 800.

$\Delta f$ Correction Circuit

The circuit in FIG. 6 is the heart of the control system of the present invention. A JK flip-flop 141 has a first input terminal 142 connected to the line 28 (FIG. 1) to receive the clock pulses of the third decade divider. These clock pulses are one one-hundredth the frequency of the VCO 11 (or one one-thousandth of this frequency if the decade divider 14 is in use). The flip-flop 141 also has another input terminal 143 connected to the line 26 (FIG. 1) to receive the reset pulses. These pulses have a repetition rate of $R=f_c/N$, and this repetition rate is at least as high as, and normally higher than, the repetition rate of the pulses supplied to the terminal 142. The flip-flop circuit 141 has an output terminal 144 connected to a potentiometer 145, which in turn is connected to an integrating circuit 146. The output of the integrating circuit 146 is connected by way of an emitter follower amplifier 147 to one end of the vernier potentiometer 32. The end to which the amplifier 147 is connected may be considered as high-frequency end of the potentiometer of the end that corresponds to the setting 999 on the carrier frequency vernier indicator 33 in FIG. 1.

The low-frequency, or zero, end of the potentiometer 32 is connected to the emitter of a transistor 148 which is controlled by a direct voltage, the magnitude of which is determined by the "zero set" potentiometer 29. A 10 kHz. calibrating control includes the potentiometer 31, the arm of which is connected to the base of the transistor 148 to control the bias on this transistor.

The operation of the $\Delta f$ correction circuit may be considered as starting with the reception at the terminal 143 of one of the reset pulses shown in FIG. 7*a* by way of the line 26. This resets the flip-flop 141 so that the output terminal 144 is high, as shown in FIG. 7*c*. This terminal remains high until the occurrence of the next third decade clock pulse 127, shown in FIG. 7*c*. This pulse is received by way of the line 28, at which time the output terminal 144 goes low and remains low until the next pulse over the line 26. Thus the output signal shown in FIG. 7*c* for the terminal 144 is a pulse wave having a duty cycle which is very low if the third decade clock pulses have a much higher repetition rate than the reset pulses. This would be the case if the output frequency $f_c$ of the VCO 11 in FIG. 1 were at the high end of its permissible range. On the other hand, if the output frequency $f_c$ of the VCO 11 were at the low end of its frequency range, the repetition rate of the pulses applied by way of the line 28 would have a repetition rate not much lower than the repetition rate of the pulses applied by way of the line 26. This would produce a pulse wave as shown in FIG. 7*c* having a duty cycle inversely proportional to the frequency $f_c$ of the VCO 11, as required. This pulse wave is integrated by the integrator 146 to derive its average value, which is applied as a DC signal to the base of the emitter follower amplifier 147. Since the voltage at the zero end of the potentiometer 32 is maintained at a fixed value by the setting of the potentiometer 29, the total voltage across the potentiometer 32 is essentially determined by the voltage output of the amplifier 147 and this, in accordance with the fact that the average value of the rectangular pulse signal at the output terminal 144 is inversely proportional to the frequency $f_c$.

The Crystal Calibrator Circuit

The crystal calibrator circuit shown in FIG. 9 is not shown in the overall system in FIG. 1. It comprises an input terminal 251 to which a pulse signal is applied which is nominally 640 kHz. This signal passes through an amplifier 252 and is connected to two other amplifiers 253 and 254. The output at the amplifier 253 is connected through an attenuator 256 to a crystal filter 257. The crystal filter is very sharply tuned to the fourth harmonic of 640 kHz. or 2.5600 MHz., and the output of the filter is connected through a tuned FET amplifier 258 to a calibrating meter 259.

The amplifier 254 is connected through a potentiometer 261 to another sharply tuned crystal filter 262 tuned to a frequency 1 percent higher than the filter 257, that is to a frequency of 2.58560 MHz. The output of that crystal filter 262 is connected by way of a tuned FET amplifier 263 to the same calibrating meter 259.

In calibrating the VCXO's 39 and 41 (FIG. 1), the vernier potentiometer 32 is set to "0" and the potentiometer 29 is adjusted to adjust the VCXO's 39 and 41 so that the output frequency of the mixer 43 is exactly 640 kc. as indicated by a peak reading on the meter 259 in response to a signal passing through the crystal filter 257. Then the vernier 32 is set to the high end of its scale, which shifts the output frequency of the VCO 11 by 10 kHz. and the resistor 31 is adjusted to cause the meter 259 again to reach a peak reading.

Phase Comparator Circuit

The phase comparator circuit 36 of FIG. 1 is shown in greater detail in FIG. 8 and comprises an input terminal 152 to which the reference signal 35 in the form of a square wave having a repetition rate of 10 kHz. is applied. The input terminal is connected to two complementary transistors 153 and 154, the collector output terminals of which are connected to the base terminals of two transistors 155 and 156 which, together, form a pulse amplifier with relatively low output impedance for both the positive-going and negative-going sections of the square wave 35.

The collectors of the transistor 155 and 156 are connected together to an integrator circuit 157 comprising a resistor 158 and a capacitor 159 to transform the square wave into triangular wave 160. The triangular wave is connected to the source terminal and field effect transistor (FET) 161, the drain terminal of which is connected to a capacitor 163.

The drain terminal of the FET 161 is connected to the source terminal of a second FET 172, which in turn has its drain terminal connected to a capacitor 173, and the gate terminal of another FET 164 connected as an impedance transformer to take advantage of the high input impedance obtainable with a FET and relatively low output impedance when the FET is connected as a drain follower. The output terminal of the follower 164 is connected to an output terminal 165 and this terminal is the one connected to the DC amplifier and low-pass filter 38 in the system in FIG. 1. The phase comparator circuit has another input terminal 166 which the one microsecond pulse signal 34 from the third decade divider 19 (FIG. 1) is connected. This one microsecond pulse signal is applied to a first amplifier 167, the output collector electrode of which is connected to the gate electrode of the FET 161 to make the FET 161 nonconductive upon the occurrence of each of the pulses 168. The output of the amplifier also connects to another transistor amplifier 169, the collector output terminal of which is connected to the gate electrode of the second FET 172.

The operation of the circuit in FIG. 8 is as follows: the square wave 35 is transformed into the triangular wave 160 by the integrating circuit 157 and is applied to the source electrode of the FET 161. Normally this FET is conductive so that the same triangular wave is applied across the capacitor 163. At the occurrence of each of the one microsecond pulses 168, the transistor amplifier 167 becomes conductive and the voltage at the collector drops, turning off the FET 161, or making it nonconductive. For the duration of the one microsecond pulses, the triangular wave 160 is no longer applied across the capacitor 163 and the voltage of the capacitor remains substantially constant.

The negative pulse produced at the collector of the transistor 167 is applied to turn off the transistor 169 to generate a positive-going pulse at its collector. This pulse is connected to the gate electrode of the FET 172 to render this FET conductive for the duration of the positive-going pulse. As a result, the capacitor 163 is momentarily connected directly in parallel with the capacitor 173. The capacitor 173 preferably has a considerably lower capacitance than the capacitor 163. For example, a capacitance of 0.01 mfd. for the capacitor 163 and 0.001 mfd. for the capacitor 173. The connection of the capacitor 173 across the capacitor 163 therefore does not discharge the capacitor 163 substantially.

At the end of each of the one microsecond pulses 168, the transistor amplifier 167 becomes nonconductive and the transistor amplifier 169 becomes conductive causing the FET 161 to become conductive and the FET 172 to become nonconductive. This again connects the capacitor 163 in parallel with the capacitor 159 of the integrator circuit 157 and disconnects the capacitor 173 from its charging source and leaves it connected only to the input circuit of the FET 164. The voltage at the output terminal 165 follows the voltage across the capacitor 173 and if the one microsecond pulse 168 occurs at the same portion of the triangular wave 160, the output voltage will remain constant. This is the condition for phase lock of the VCO 11 in the system in FIG. 1. However, if the one microsecond pulse 168 is not in precise synchronization with the square wave 35 from which the triangular wave 160 is generated, the output voltage at the terminal 165 will change and cause the VCO 11 to shift frequency enough to bring it back into phase lock.

What I claim is:

1. A signal generator comprising:

a. a main source producing a signal having a frequency $f_c$;

b. a frequency divider system connected to said main source to produce a first signal having a frequency $R=f_c/N$, in which $N$ is an integral divisor;

c. means connected to said main source of signal to produce a DC signal having a value inversely proportional to $f_c$;

d. means to generate a reference signal having a frequency approximately equal to $R$;

e. means connected to said means to produce said DC signal to apply a controlled fraction of said DC signal to said means to generate said reference signal to modify the frequency of the reference signal produced therein;

f. a comparison circuit connected to said divider system to compare said first signal with said reference signal to produce a control signal; and g. means to connect said control signal to said main source of signal to control the frequency $f_c$.

2. The signal generator of claim 1 in which said means to produce a DC signal is connected to said divider system.

3. The signal generator of claim 1 in which said means to produce a DC signal comprises means to generate a rectangular pulse signal having a duty cycle inversely proportional to $f_c$, and means to integrate said pulse signal to obtain the average DC value thereof.

4. The signal generator of claim 3 in which said divider system comprises flip-flop means to produce a second signal having a frequency $r=f_c/n$ in which $n$ is a unit of the largest digit of the number $N$, and said flip-flop is connected to said divider system to be reset by said first signal and to be actuated by said second signal to produce said rectangular pulse signal.